United States Patent
Tysoe et al.

(10) Patent No.: US 7,642,122 B2
(45) Date of Patent: Jan. 5, 2010

(54) METHOD FOR FORMING NITRIDE CRYSTALS

(75) Inventors: Steven Alfred Tysoe, Ballston Spa, NY (US); Dong-Sil Park, Niskayuna, NY (US); John Thomas Leman, Niskayuna, NY (US); Mark Philip D'Evelyn, Niskayuna, NY (US); Kristi Jean Narang, Voorheesville, NY (US); Huicong Hong, Niskayuna, NY (US)

(73) Assignee: Momentive Performance Materials Inc., Albany, NY (US)

( * ) Notice: Subject to any disclaimer, the term of this patent is extended or adjusted under 35 U.S.C. 154(b) by 290 days.

(21) Appl. No.: 11/973,182

(22) Filed: Oct. 5, 2007

(65) Prior Publication Data

US 2008/0087919 A1    Apr. 17, 2008

Related U.S. Application Data

(60) Provisional application No. 60/828,646, filed on Oct. 8, 2006.

(51) Int. Cl.
*H01L 21/00* (2006.01)
*H01L 33/00* (2006.01)

(52) U.S. Cl. ......................................... 438/95; 257/98

(58) Field of Classification Search .................. 117/21, 117/36, 71–78; 257/98–102; 438/95, 900
See application file for complete search history.

(56) References Cited

U.S. PATENT DOCUMENTS

| | | | |
|---|---|---|---|
| 3,450,499 A | 6/1969 | Yates | |
| 7,078,731 B2 * | 7/2006 | D'Evelyn et al. | 257/94 |
| 7,125,453 B2 | 10/2006 | D'Evelyn et al. | |
| 7,316,746 B2 * | 1/2008 | D'Evelyn et al. | 117/71 |
| 7,582,498 B2 * | 9/2009 | D'Evelyn et al. | 438/46 |
| 2003/0140845 A1 | 7/2003 | D'Evelyn et al. | |
| 2005/0087753 A1 | 4/2005 | D'Evelyn et al. | |
| 2006/0169996 A1 | 8/2006 | D'Evelyn et al. | |

OTHER PUBLICATIONS

RB Campbell et al "Solid State Ultraviolet Devices for Fire Detection in Advanced Flight Vehicles" (1967) *Technical Report AFATP-TR-67-23* p. 88-110.
Slack et al. "Growth of High Purity Aln Crystals" (1967) *J. Cryst. Growth* 34, p. 263-279.
Bouaiss et al. "Solvothermal Synthesis of Aln" (2000) *Diamond Relat. Mater.* 18 p. 227-232.
BT Adekore et al. "Ammonothermal Synthesis of Aluminum Nitride Crystals on Group III—Nitride Templates" *J. of Electronic Materials* 35:5 p. 1104-1111.
D. Peters "Ammonothermal Synthesis of Aluminum Nitride" (1990) *J. of Crystal Growth* 104 p. 411-418.
Kolis et al. "Materials Chemistry and Bulk Crystal Growth of Group III Nitrides in Supercritical Ammonia" (1998) *Mat. Res. Soc. Symp. Proc.* 495 p. 367-372.
Dwilinski et al. "Ammono Method of GaN and AlN Production" (1998) *Diamond and Related Materials* p. 1348-1350.
Ranade et al. Enthalpy of Formation of Gallium Nitride (2000) *J. Phys. Chem.* 104 p. 4060-4063.
Slack et al. "AlN Single Crystals" (1977) *J. of Crystal Growth* 42 p. 560-563.

* cited by examiner

*Primary Examiner*—Calvin Lee
(74) *Attorney, Agent, or Firm*—Joseph E. Waters

(57) ABSTRACT

A method for growing a nitride crystal and a crystalline composition selected from one of AlN, InGaN, AlGaInN, InGaN, and AlGaNInN is provided. The composition comprises a true single crystal, grown from a single nucleus, at least 1 mm in diameter, free of lateral strain and tilt boundaries, with a dislocation density less than about $10^4$ cm$^{-2}$.

13 Claims, No Drawings

METHOD FOR FORMING NITRIDE CRYSTALS

CROSS REFERENCE TO RELATED APPLICATION

This application claims priority to a provisional patent application No. 60/828,646, entitled "Method for Forming Nitride Crystals," filed on Oct. 8, 2006 by the inventors of this application.

FIELD OF INVENTION

The invention relates to a method for growing high quality nitride crystal for use in electronic devices. In particular, the invention relates to a method for growing a nitride crystal and a crystalline composition selected from one of AlN, InGaN, AlGaInN, InGaN, and AlGaNInN. The composition comprises a true single crystal, grown from a single nucleus, at least 1 mm in diameter, free of lateral strain and tilt boundaries, with a dislocation density less than about $10^4$ cm$^{-2}$.

BACKGROUND OF THE INVENTION

Various methods for growing high quality gallium nitride (GaN) crystals are being developed by laboratories across the world. However, other nitride crystals, such as AlN and InN, would be very useful as substrates for applications such as UV-LEDs, UV-photodetectors, and field-effect transistors but are not currently available. The bandgap of AlN (6.2 eV) is much larger than that of GaN (3.4 eV), making it the substrate of choice for deep-UV light emitters and detectors. In addition, the thermal conductivity is significantly higher than that of GaN, potentially making it superior as a substrate for certain electronic devices, such as field-effect transistors (also known as high electron mobility transistors). InN has the highest electron velocity of any known nitride, and may be useful for high-frequency devices.

There is substantial prior art in the growth of crystalline nitrides other than GaN, but none of it employs supercritical solvents at pressures above about 5 kbar. None of the existing approaches are yet commercially viable from the standpoints of simultaneous requirements for: (i) producing large ($\geq$2" in diameter), single-crystal boules suitable for slicing into wafers, as with conventional silicon and gallium arsenide substrates; (ii) producing high-quality crystals, as characterized by low concentrations of impurities and dislocations and narrow x-ray rocking curves; and (iii) growth rates that are high enough for moderate-cost production.

The technique for bulk AlN growth that has probably provided the largest crystals grown to date is sublimation-recondensation, as disclosed originally by Slack and McNelly [J. Cryst. Growth 34, 263 (1976) and 42, 560 (1977)]. However, this technique requires extremely high temperatures (ca. 2250° C.), involves contact with a crucible, which can cause stresses and contamination, and tends to produce crystals with substantial concentrations of dislocations, low-angle grain boundaries, and polycrystalline domains. Several authors have disclosed growth of small AlN crystals in supercritical ammonia, notably Peters [J. Cryst. Growth 104, 411 (1990)], Kolis et al. [Mater. Res. Soc. Symp. Proc. 495, 367 (1998)], Dwilinski et al. [Diamond Relat. Mater. 7, 1348 (1998)], and Demazeau et al. [High Pressure Research 18, 227 (2000)]. However, these latter approaches were limited by the type of apparatus available (autoclaves) to a maximum pressure of 2-5 kbar and a maximum temperature of 400-600° C., produced crystals in the micron size range, and the growth rate was very low. AlN growth in a liquid flux, such as $Ca_3N_2$ [U.S. Pat. No. 3,450,499] or $Na_3AlF_6$ [R B Campbell et al., Technical Report AFAPL-TR-67-23 (1967)] has also been reported, but in each case the crystals produced were no larger than 1 mm.

Single crystal growth of InN has not been reported by any method, to the best of our knowledge. The inventors have disclosed methods for growing high-quality GaN crystals in supercritical ammonia. However, straightforward application of these methods to the growth of AlN were unsuccessful. Al and In are both more oxophilic than Ga, and the present inventors have discovered that reduction of the oxide contents of the raw material was necessary in order for successful crystal growth in supercritical ammonia.

Techniques for preparing high quality nitride crystal are provided herein.

SUMMARY OF THE INVENTION

In one aspect, the invention relates to a method for growing a nitride crystal, comprising providing source material containing less than 1 weight percent oxygen; providing a mineralizer; optionally, providing one or more seed crystals; providing a capsule; filling the capsule with a nitrogen-containing solvent, such as ammonia; processing the capsule and contents in a supercritical fluid at a temperature higher than about 550° C. and a pressure higher than about 2 kbar. for growing a crystalline composition.

In yet another aspect, the invention relates to a nitride crystal comprising a single crystal grown from a single nucleus having a diameter of at least 1 mm, free of lateral strain and tilt boundaries, with a dislocation density less than about $10^4$ cm$^{-2}$, wherein the nitride crystal is selected from the group consisting of InGaN, AlGaInN, InGaN, AlGaNInN, and AlN.

The present invention provides high quality nitride crystal, for example, a true aluminum nitride single crystal, grown from a single nucleus, at least 1 mm in diameter, free of lateral strain and tilt boundaries, with a dislocation density less than about $10^4$ cm$^{-2}$, for use in preparing homoepitaxial devices, such as, for example, light emitting diode, laser diode, photodetector, avalanche photodetector, field-effect transistor, bipolar junction transistor, thyristor and the like.

DETAILED DESCRIPTION OF THE INVENTION

As used herein, approximating language may be applied to modify any quantitative representation that may vary without resulting in a change in the basic function to which it is related. Accordingly, a value modified by a term or terms, such as "about" and "substantially," may not to be limited to the precise value specified, in some cases.

In the discussion that follows, specific reference will be made for a method for growing AlN crystals. However, the methods are applicable to growth of a variety of other nitrides, including InN and $Al_xGa_{1-x-y}In_yN$, wherein $0\leq x$, y, x+y$\leq 1$. In the discussion that follows, references to AlN or aluminum nitride will also be understood to also refer to an aluminum-containing nitride or to $Al_xGa_{1-x-y}In_yN$, wherein $0\leq x$, y, x+y$\leq 1$. In some embodiments, at least one of x or y is greater than 0.05, or 0.10, 0.20, or 0.50 in the nitride crystal.

The invention comprises providing source AlN and a suitable mineralizer to a capsule, filling with condensed ammonia or other nitrogen-containing solvent, sealing, and treating at high pressure and high temperature (HPHT), and the crystalline AlN formed thereby. Aluminum nitride crystals are grown by recrystallization in a supercritical fluid, including but not limited to ammonia, hydrazine, methylamine, ethylenediamine, melamine, or other nitrogen-containing fluid. In the preferred embodiment, a temperature gradient causes recrystallization to occur from one region of a cell to another. The source material can comprise single crystal or polycrystalline AlN. Single crystal or polycrystalline AlN can be grown by a number of methods known in the art. According to an embodiment of the invention, other forms of AlN can also be used, for example, $Al_xGa_{1-x-y}In_yN$, wherein $0 \leq x$, y, $x+y \leq 1$, and at least one of x or y is greater than zero, $Al_xGa_{1-x-y}In_yN$, wherein $0 \leq x$, y, $x+y \leq 1$, and at least one of x or y is greater than 0.05, $Al_xGa_{1-x-y}In_yN$, wherein $0 \leq x$, y, $x+y \leq 1$, and at least one of x or y is greater than 0.10, $Al_xGa_{1-x-y}In_yN$, wherein $0 \leq x$, y, $x+y \leq 1$, and at least one of x or y is greater than 0.20, or $Al_xGa_{1-x-y}In_yN$, wherein $0 \leq x$, y, $x+y \leq 1$, and at least one of x or y is greater than 0.50.

According to another embodiment, still other forms of AlN include amorphous AlN or an AlN precursor such as Al metal or an Al compound. However, for embodiments with a temperature gradient, it is important that the source AlN comprise one or more particles that are sufficiently large in size so as not to pass through the openings in the baffle that separate the source region from the crystal growth region of the capsule. In addition, the inventors have discovered that for growth of non-GaN nitrides to be successful, the oxide content of the source material should be less than about 1 weight percent.

Nucleation can be induced on the crystal growth portion of the cell without a seed crystal or with a non-AlN seed crystal such as silicon carbide, but the process is easier to control if an AlN seed crystal is provided. The seed crystal is preferably larger than 1 mm in diameter and of high quality, free of tilt boundaries and having a dislocation density less than about $10^8$ cm$^{-2}$, and preferably below about $10^5$ cm$^{-2}$. A variety of types of AlN seed crystals may be provided, including an epitaxial AlN layer on a non-AlN substrate such as sapphire or SiC, a free-standing AlN film grown by HVPE or MOCVD, an AlN crystal grown by sublimation/recondensation, or a crystal grown in a supercritical fluid in a previous run.

The presence of oxygen in the system (raw materials, vessel) is deleterious to the ammonothermal growth of nitrides. For example, several groups have observed oxygen contents above $10^{18}$ cm$^{-3}$, above $10^{19}$ cm$^{-3}$, and even above $10^{20}$ cm$^{-3}$ in ammonothermally-grown GaN. However, it has apparently not been realized that the role of oxygen is much more deleterious in the case of growth of both AlN and InN than it is with GaN. A rough assessment of the ease with which ammonia may reduce the group III metal nitride may be achieved from the free energy of formation of the pure substances, as shown in Table 1.

TABLE 1

Free energies of reaction $\Delta G°$ for selected oxide-reduction reactions (kJ/mol). Data is from I. Barin, with a correction for the enthalpy of formation of GaN [Ranade et al., J. Phys. Chem. B 104, 4060 (2000)]

| T (K) | $Al_2O_3 + 2NH_3 =$ $2AlN + 3H_2O$ | $Ga_2O_3 + 2NH_3 =$ $2GaN + 3H_2O$ | $In_2O_3 + 2NH_3 =$ $2InN + 3H_2O$ |
|---|---|---|---|
| 800 | 269 | 16 | 127 |
| 900 | 252 | 1 | 111 |
| 1000 | 236 | −14 | 96 |
| 1100 | 219 | −29 | 80 |
| 1200 | 203 | −44 | 65 |

At temperatures of approximately 900K and above, ammonia can readily reduce gallium oxide to gallium nitride, in qualitative agreement with the observation that GaN may be grown ammonothermally even when large quantities of oxygen or oxide are present in the raw materials. However, ammonia does not readily reduce either aluminum oxide or indium oxide at any of these temperatures. This result is surprising in the sense that the thermodynamics of a given reaction type typically vary monotonically as one passes down a column in the Periodic Table (Al—Ga—In). Accordingly, improved results obtain when the oxygen content of the raw materials is less than 1%, or even further when the oxygen content is less than 0.1%, less than 0.01%, less than 0.001% (10 ppm), or less than 1 ppm.

In one embodiment, the source material and one or more seeds, if used, are placed in a pressure vessel or capsule that is divided into at least two regions by means of a porous baffle. An exemplary capsule is described by D'Evelyn et al., see U.S. application Ser. No. 09/683,659, filed Jan. 31, 2002. The baffle may comprise a plate with a plurality of holes in it, or a woven metal cloth. The fractional open area of the baffle is between 1% and 50%, and preferably between about 5% and about 25%. Transport of nutrient from the source material to the seed(s) or growing crystal(s) is optimized in the supercritical fluid if the colder portion of the capsule is above the warmer portion, so that self-convection stirs the fluid. In many solvents the solubility of GaN increases with temperature, and in this case the source material should be placed in the bottom portion of the capsule and the seed(s) in the top portion of the capsule. The seed crystal(s) are preferably hung, for example, by a wire through a hole drilled through the seed, so as to allow crystal growth in all directions with a minimum of interference from container walls or other materials. However, in the case of some solvents the solubility of GaN decreases with temperature. In this case the seed crystal (s) should be placed in the lower portion of the capsule and the source material in the upper portion of the capsule. The source material is preferably placed in a porous basket above the baffle rather than directly on top of the baffle, as the latter would impede transport of fluid and nutrient through the baffle.

In a another embodiment, the baffle is omitted from the capsule so that there is only one chamber, and recrystallization occurs locally. A mineralizer is also added to the capsule, in order to increase the solubility of AlN in the solvent, either together with the source material or separately. According to an embodiment of the invention, the mineralizer comprises at least one of (i) nitrides, such as $Li_3N$, $Mg_3N_2$, and $Ca_3N_2$; (ii) amides, such as $LiNH_2$, $NaNH_2$, and $KNH_2$; (iii) urea and related compounds; (iv) ammonium salts, such as $NH_4F$ and $NH_4Cl$; (v) halide, chalcogenide, or nitrate salts, such as NaCl, $Li_2S$, or $KNO_3$; (vi) azide salts, such as $NaN_3$; (vii) other Li salts; (viii) compounds formed by chemical reaction of at least two of the above with one another, such as $Na_3AlF_6$; and (ix) compounds formed by chemical reaction of at least one of the above with AlN and/or Al.

In one embodiment, the mineralizer comprises at least one of HX, $NH_4X$, $MX_3$, or a compound formed by reaction of at two of these species or with ammonia, where X is a halide (F, Cl, Br, I) and M is a group III metal (B, Al, Ga, In). The present inventors have found that $NH_4F$ and $NH_4Cl$ serve as effective mineralizers for ammonothermal GaN growth, particularly at temperatures above 550° C. and pressures above 5 kbar. Without wishing to be bound by theory, the inventors believe that transport occurs by reaction of HX, where $NH_4X$ can be considered as HX dissolved in ammonia, with MN to form $MX_3$ and ammonia, as described by equation (1).

$$MN + 3HX = MX_3 + NH_3 \qquad (1)$$

The transporting species is thus $MX_3$, presumably solvated with ammonia. In the case of $NH_4F$, dissolution of raw material occurs on the cold end of the cell and crystal growth occurs on the hot end of the cell. In other words, the reaction indicated schematically by equation (1) is exothermic, so that the more stable species on the right predominates at low temperatures and the equilibrium shifts to the left at higher temperatures. Consistent with this notion, at the completion of a crystal growth run the cell is found to be filled with white needles, which are identified by x-ray diffraction as comprising $GaF_3(NH_3)_2$ and $(NH_4)_3GaF_6$, whose structures are known from the literature. By contrast, in the case of $NH_4Cl$, dissolution of raw material occurs on the hot end of the cell and crystal growth occurs on the cold end of the cell. In other words, the reaction indicated schematically by equation (1) is endothermic, so that the more stable species on the left predominates at low temperatures and the equilibrium shifts to the right at higher temperatures. Consistent with this notion, at the completion of a crystal growth run the cell is found to be filled with white powder, which comprises mainly $NH_4Cl$ with only traces of gallium-containing compounds.

To some extent the behavior of the mineralizers $NH_4F$ and $NH_4Cl$ in crystal growth of GaN can be understood by considering free energies of reaction of pure substances, which neglects the free energies of solvation of both HX and $MX_3$ and includes the lattice energy of crystalline $MX_3$, which of course is not present in solution. Selected results, limited in part by the availability of free energies of formation of some of the chemical species involved, are shown in Table 2.

The fourth and fifth columns in Table 2 give some insight into ammonothermal crystal growth of AlN, particularly by comparison with the observed theoretical and experimental trends with GaN. Comparing the fourth and second columns, we see that formation of $AlF_3$ is considerably more favorable than formation of $GaF_3$, although the stability of both decreases at elevated temperatures. Formation of may therefore be effectively irreversible at modest temperatures, and crystal growth of AlN ineffective. However, at temperatures above about 1200K, $NH_4F$ may serve as an effective mineralizer for AlN crystal growth. Inspecting the fifth column, we see that formation of $AlCl_3$ is not nearly as favorable as that of $AlF_3$, but appears to be roughly comparable with an extrapolation of the results for formation of $GaCl_3$. $NH_4Cl$ is therefore concluded to be an effective mineralizer for ammonothermal crystal growth of AlN. The data in the fifth column suggests that AlN crystal growth would occur on the hot end. However, by analogy to the contrary behavior observed with GaN, we expect that AlN crystal growth in fact occurs at the cold end. Crystal growth at the cold end may be advantageous for control of an ammonothermal crystal growth process in that it may be easier to reduce or eliminate wall nucleation.

Comparing the fourth and fifth columns, we see that formation of a mixed halide, e.g., $AlFCl_2$, should be intermediate in free energy of formation compared to the pure halides. Formation of such species may be favored, due to entropy, by a dilute mixture of $NH_4F$ in $NH_4Cl$ as mineralizer. Thus, in one embodiment, AlN crystals are grown using a dilute mixture of $NH_4F$ in $NH_4Cl$ as mineralizer.

TABLE 2

Free energies of reaction $\Delta G°$ for selected mineralizer-transport reactions (kJ/mol). Data is from I. Barin, with a correction for the enthalpy of formation of GaN [Ranade et al., J. Phys. Chem. B 104, 4060 (2000)]

| T (K) | GaN + 3HF = $GaF_3$ + $NH_3$ | GaN + 3HCl = $GaCl_3$ + $NH_3$ | AlN + 3HF = $AlF_3$ + $NH_3$ | AlN + 3HCl = $AlCl_3$ + $NH_3$ | InN + 3HCl = $InCl_3$ + $NH_3$ |
|---|---|---|---|---|---|
| 400 | −141 | −34 | | | |
| 500 | −115 | −12 | | | |
| 600 | −89 | | | | |
| 700 | −63 | | −223 | 17 | −102 |
| 800 | −38 | | −196 | 35 | −76 |
| 900 | −13 | | −168 | 52 | |
| 1000 | 12 | | −141 | 69 | |
| 1100 | 37 | | −114 | | |
| 1200 | 61 | | −87 | | |

Inspecting the second column in Table 2, we see that the simplified thermodynamics correctly predicts the stability of the products ($GaF_3$+$NH_3$) at low temperature and the tendency for reaction (1) to shift to the left, i.e., deposition of GaN, at elevated temperatures. Comparing the second and third columns, we see that the simplified thermodynamics also correctly predicts the reduced tendency for gallium chloride formation compared to gallium fluoride formation. However, the very limited data on gallium chloride formation suggests that reaction (1) will shift to the left at elevated temperatures. The predicted behavior is similar to the trend with the fluoride, but is contradicted by experimental observations, as GaN crystal growth occurs on the cold end with this chemistry. It may be that the trend in the third column of Table 2 reverses at temperatures above 600K, or it may be that the thermodynamics of ammonia solvation, neglected in this simplified analysis, varies enough between HF, HCl, and the gallium fluorides and chlorides to shift the overall equilibrium and trend with temperature.

Generalizing this result, if formation of a pure $MX_3$ transport species is too stable, from the standpoint that it forms essentially irreversibly in the desired temperature range, one may obtain improved mineralization by dilution of $NH_4X$ in $NH_4Y$ as mineralizer, where formation of $MY_3$ is less favorable than that of $MX_3$. Conversely, if formation of a pure $MY_3$ transport species is insufficiently stable, from the standpoint that it forms at very low concentrations in the desired temperature range, one may obtain improved mineralization by mixing of $NH_4Y$ with $NH_4X$ as mineralizer, where formation of $MX_3$ is more favorable than that of $MY_3$.

The sixth column of Table 2 suggests that $NH_4Cl$ will be an effective mineralizer for InN crystal growth. If formation of InCl3 occurs with too strong an equilibrium constant, then one can use a mixture of $NH_4Cl$ and one or more of $NH_4F$, $NH_4Br$ or $NH_4I$ as a mineralizer.

In one embodiment, polycrystalline AlN or InN is used for crystal growth of AlN or InN, respectively. In another embodiment, a mixture of polycrystalline AlN, GaN, and/or InN is used for crystal growth of $Al_xIn_yGa_{1-x-y}N$. In still another embodiment, polycrystalline $Al_xIn_yGa_{1-x-y}N$ is used for crystal growth of $Al_xIn_yGa_{1-x-y}N$. The polycrystalline nitride raw material may be formed by a process such as that described by D'Evelyn et al. in U.S. patent application Ser. No. 11/313,451, "CRYSTALLINE COMPOSITION, DEVICE, AND ASSOCIATED METHOD", filed Dec. 20, 2005, which is hereby incorporated by reference.

In one embodiment, one or more seed crystals are provided. The seed crystals may comprise the substance being crystallized, e.g., AlN, InN, or $Al_xIn_yGa_{1-x-y}N$. In another embodiment, the seed crystal comprises another crystalline material. Examples of compositions for seed crystals are shown in Table 3.

TABLE 3

Crystals for use as seeds in nitride crystal growth. The lattice constants listed are the "a" lattice constants for hexagonal crystals, as would be suitable for growth in the c direction. For the cubic crystals, the lattice constants listed with a yellow highlight are pseudo lattice constants for the (111) planes, as would be appropriate for growth of 2H AlN, GaN, InN, or $Al_xIn_yGa_{1-x-y}N$. In the case pf ZnO the "a" pseudo lattice constant is 3.25 Å.

| Crystal | Lattice constant (Å) | Structure |
|---|---|---|
| InN | 3.5446 | Hexagonal/trigonal |
| AlN | 3.112 | Hexagonal/trigonal |
| GaN | 3.189 | Hexagonal/trigonal |
| $Ga_xIn_{1-x}N$ | 3.189-3.5446 | Hexagonal/trigonal |
| SiC | 3.08 | Hexagonal/trigonal |
| $Ga_xAl_{1-x}N$ | 3.112-3.189 | Hexagonal/trigonal |
| InAlN | 3.112-3.5446 | Hexagonal/trigonal |
| $Al_yGa_{1-x-y}In_xN$ | 3.112-3.5446 | Hexagonal/trigonal |
| ZnO | 4.58 | Hexagonal/trigonal |
| BN (Hexagonal) | 2.5-2.9 | Hexagonal/trigonal |
| $B_xGa_{1-x}N$ | 2.5-3.189 | Hexagonal/trigonal |
| $B_xAl_{1-x}N$ | 2.5-3.112 | Hexagonal/trigonal |
| $B_xIn_{1-x}N$ | 2.5-3.5446 | Hexagonal/trigonal |
| MgAl2O4 | 8.083 | Cubic <111> |
| BP | 4.52 | Cubic <111> |
| $(Ga_xIn_{1-x})_2Se_3$ | ~6.843 | Hexagonal/trigonal |
| ScAlMgO4 | 3.236 | Cubic <111> |
| YFeZnO4 | 3.489 | Cubic <111> |
| MgO | 4.213 | Cubic <111> |
| Fe2NiO4 | 3.798 | Cubic <111> |
| LiGa5O8 | 3.370 | Cubic <111> |
| Na2MoO4 | 3.230 | Cubic <111> |
| Na2WO4 | 3.237 | Cubic <111> |
| In2CdO4 | 3.230 | Cubic <111> |
| LiGaO2 | 3.021-3.251 | Orthorhombic <001> |
| Ca8La2(PO4)6O2 | 9.336 | Hexagonal/trigonal |
| Sapphire | 4.7577 | Hexagonal/trigonal |

The capsule is then filled with a substance that will comprise a supercritical fluid under processing conditions, such as ammonia, hydrazine, methylamine, ethylenediamine, melamine, or other nitrogen-containing fluid. The preferred embodiment employs ammonia as the solvent. Of the free volume in the capsule (the volume not occupied by the source material, seed(s), and baffle), between 25% and 100%, or preferably between 70% and 95%, are filled with solvent and the capsule is sealed. Methods for filling and sealing the capsule are described by D'Evelyn et al., see U.S. application Ser. No. 09/683,659, filed Jan. 31, 2002.

The sealed capsule is then placed in a vessel capable of generating temperatures between about 550° C. and about 3000° C., or preferably between about 550° C. and about 1200° C. and a pressure between about 5 kbar and about 80 kbar, or preferably between about 5 kbar and about 20 kbar. An exemplary pressure vessel is described by D'Evelyn et al., see U.S. application Ser. No. 09/683,658, filed Jan. 31, 2002 and U.S. application 60/435,189, filed Dec. 18, 2002.

The capsule is heated to the growth temperature, preferably between about 550° C. and 1200° C., at an average rate between about 5° C./hr and 1000° C./hr. A temperature gradient may be present in the capsule, due to asymmetric placement of the capsule in the cell, non-symmetric heating, or the like. However, this temperature gradient has the effect of creating a supersaturation throughout the heating sequence, which the inventors have found promotes spontaneous nucleation. The temperature gradient at the growth temperature may be initially held small or negative and then increased, as described by D'Evelyn et al., see U.S. application Ser. No. 10/329,981, filed Dec. 27, 2002, in order to minimize spontaneous nucleation and to etch away any spontaneously-nucleated crystals that may have formed during heating. During the crystal growth the temperature gradient may be held at a value between 5° C. and 300° C. and may be adjusted upward or downward during growth.

At the conclusion of the growth period the temperature of the capsule is ramped down at a rate between about 5° C./hr and 1000° C./hr, and preferably between about 5° C./hr and 300° C./hr so as to minimize thermal shock to the crystal(s). The cell is removed from the pressure vessel and the capsule is removed from the cell. The solvent may be conveniently removed by chilling the capsule to reduce the vapor pressure of the solvent below 1 bar, puncturing the capsule, then allowing it to warm so that the solvent evaporates. The capsule is cut open and the crystal(s) removed. The crystal(s) may be washed by at least one of water, alcohol or other organic solvent, or mineral acids to remove mineralizer or other material.

The crystal may be characterized by standard methods that are known in the art. The dislocation density may be quantified by cathodoluminescence (CL) imaging or by etch-pit density measurements. The optical absorption and emission properties can be determined by optical absorption and photoluminescence spectroscopies, well known in the art. The electrical properties can be determined by Van der Pauw Hall effect measurements, by mercury-probe CV, and by hot-probe techniques.

Based on the results that have been observed with growth of GaN crystals by a closely-related method, it is expected that the nitride crystals grown by the present method will grow from a single seed or nucleus, be free of strain, and have a dislocation density less than $10^4$ cm$^{-2}$, and preferably below $10^3$ cm$^{-2}$. The crystal may be sliced into one or more wafers by methods that are well known in the art. According to an embodiment of the invention, a wafer prepared from the nitride crystal as described above can be sliced, lapped, and polished. According to another embodiment the wafer as described herein has at least one epitaxial nitride layer. The AlN crystal or wafer is useful as a substrate for epitaxial AlInGaN films, light emitting diodes, laser diodes, photodetectors, avalanche photodetectors, transistors, diodes, and other optoelectronic and electronic devices.

The invention is further illustrated by the following non-limiting examples.

EXAMPLES

Commercial AlN powder was pressed into two pills. An AlN pill weighing 0.1086 g and a pill of $NH_4F$ weighing 0.0472 g were placed in the bottom of a 0.5" copper capsule whose inner surfaces were coated with 25 μm of gold. A baffle with 5% open area was placed in the middle of the capsule, and then a second AlN pill weighing 0.0907 g and a pill of $NH_4F$ weighing 0.0512 g were placed in the top half of the capsule. The capsule was filled with 0.91 g of ammonia and then sealed. The capsule was placed in a zero-stroke high pressure apparatus, heated to a mean temperature of about 760° C. and held at this temperature for 13 hours. The capsule was then cooled and removed from the press. The capsule was punctured to allow ammonia to escape, then cut open.

The AlN pills were indistinguishable by weight or morphology from the starting material. In addition, unexpectedly, formation of an $AlF_3(NH_3)_2$ complex, which had been anticipated based on the published results of Kolis et al., was not observed. The oxygen content of the AlN powder was measured by inert gas fusion (LECO) and found to be 1.5 weight percent.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. All citations referred herein are expressly incorporated herein by reference.

The invention claimed is:

1. A method for growing a nitride crystal which comprises:
   providing source material containing less than 1 weight percent oxygen;
   providing a mineralizer;
   providing one or more seed crystals, wherein the seed crystal is larger than 1 mm in diameter;
   providing a capsule;
   filling the capsule with a nitrogen-containing solvent;
   processing the capsule and contents in a supercritical fluid at a temperature higher than about 550° C. and a pressure higher than about 2 kbar.

2. The method of claim 1, wherein the source material is $Al_xGa_{1-x-y}In_yN$, wherein $0 \leq x, y, x+y \leq 1$, and at least one of x or y is greater than zero.

3. The method of claim 1, wherein the source material is $Al_xGa_{1-x-y}In_yN$, wherein $0 \leq x, y, x+y \leq 1$, and at least one of x or y is greater than 0.05.

4. The method of claim 1 wherein the source material is AlN.

5. The method of claim 1 wherein the mineralizer is at least one of (i) a nitride; (ii) an amide; (iii) a urea; (iv) an ammonium salt; (v) a halide, chalcogenide, or nitrate salt; (vi) an azide salt and (vii) a Li salt.

6. The method of claim 5 wherein the mineralizer is at least one compound formed by chemical reaction of at least two compounds selected from components (i)-(vii).

7. The method of claim 5 wherein the mineralizer is at least one compound formed by chemical reaction of at least one of compound selected from components (i)-(vii) with AlN and/or Al.

8. The method of claim 5, wherein the mineralizer is at least one of HX, $NH_4X$, and $GaX_3$, wherein X is selected from the group consisting of F, Cl, Br, or I.

9. The method of claim 5, wherein the mineralizer is a reaction product of at least one of HX, $NH_4X$ and $GaX_3$ with at least one of HX, $NH_4X$, $GaX_3$, Ga, GaN and $NH_3$, wherein X is selected from the group consisting of F, Cl, Br, or I.

10. The method of claim 1, wherein the mineralizer is at least one compound selected from the group consisting of $Li_3N$, $Mg_3N_2$, $Ca_3N_2$, $LiNH_2$, $NaNH_2$, $KNH_2$, $NH_4F$, $NH_4Cl$, NaCl, $Li_2S$, $KNO_3$, $NaN_3$ and $Na_3AlF_6$.

11. The method of claim 1, wherein the optional seed crystal is an AlN seed crystal or a non-AlN seed crystal.

12. The method of claim 1 wherein the seed is selected from the group consisting of InN, AlN, GaN, $Ga_xIn_{1-x}N$, SiC, $Ga_xAl_{1-x}N$, InAlN, $Al_yGa_{1-x-y}In_xN$, ZnO, BN (Hexagonal), $B_xGa_{1-x}N$, $B_xAl_{1-x}N$, $B_xIn_{1-x}N$, $MgAl2O4$, BP, $(Ga_xIn_{1-x})_2Se_3$, $ScAlMgO4$, $YFeZnO4$, MgO, $Fe2NiO4$, $LiGa5O8$, $Na2MoO4$, $Na2WO4$, $In2CdO4$, $LiGaO2$, $Ca8La2(PO4)6O2$ and sapphire.

13. The method of claim 1 wherein the nitrogen-containing solvent is ammonia.

* * * * *